United States Patent [19]

Pierce

[11] 4,446,564

[45] May 1, 1984

[54] PHASE LOCKED LOOP FREQUENCY SYNTHESIZER CIRCUIT AND METHOD FOR INTERCOMPUTER COMMUNICATION ON A LOCAL NETWORK OF BROADBAND RF MODEMS

[75] Inventor: William D. Pierce, Phoenix, Ariz.

[73] Assignee: Motorola Inc., Schaumburg, Ill.

[21] Appl. No.: 328,276

[22] Filed: Dec. 7, 1981

[51] Int. Cl.³ .............................................. H04J 1/14
[52] U.S. Cl. .................................... 375/8; 340/825.5; 370/124; 455/34; 455/58
[58] Field of Search ........................................ 375/7-9, 375/36; 370/69.1, 121-124, 70, 32, 33; 340/825.5, 825.03, 825.05, 825.71, 825.73; 178/3; 455/88, 3-6, 31, 34, 87, 58, 62, 71; 371/33

[56] References Cited

U.S. PATENT DOCUMENTS

| | | | |
|---|---|---|---|
| 2,419,593 | 4/1947 | Robinson | 455/87 |
| 2,529,550 | 11/1950 | Harris | 455/87 |
| 4,013,840 | 3/1977 | Anderson | 370/124 |
| 4,225,828 | 9/1980 | Watanabe et al. | 455/87 X |
| 4,229,827 | 10/1980 | Bowman | 455/87 |
| 4,254,504 | 3/1981 | Lewis et al. | 455/87 X |
| 4,332,027 | 5/1982 | Malcolm et al. | 455/58 X |

Primary Examiner—Robert L. Griffin
Assistant Examiner—Albert W. Watkins
Attorney, Agent, or Firm—William J. Kubida

[57] ABSTRACT

A phase locked loop frequency synthesizer circuit for utilization in a broadband RF modem including a computer controlled transmit and receive function for use in the intertransmission of data on a local network comprising a plurality of the modems. According to the invention, a single phase locked loop frequency synthesizer circuit may be employed to establish both the transmit and receive frequencies, in addition to a method for the intertransmission of data between modems, in which data may be transmitted or received in a synchronous or asynchronous format on a local network.

3 Claims, 3 Drawing Figures

PHASE LOCKED LOOP FREQUENCY SYNTHESIZER CIRCUIT AND METHOD FOR INTERCOMPUTER COMMUNICATION ON A LOCAL NETWORK OF BROADBAND RF MODEMS

RELATED U.S. PATENT APPLICATIONS

U.S. patent applications either directly or indirectly related to the subject matter of the present invention include Ser. No. 328,275 filed concurrently herewith by William D. Pierce and William J. Howell for "BROADBAND RF MODEMS AND A LOCAL NETWORK THEREOF" and assigned to the assignee of the present invention.

BACKGROUND OF THE INVENTION

The field of the invention relates to phase locked loop frequency synthesizer circuits and methods for intertransmission of data between modems on a local information network.

In particular, the invention relates to broadband RF modems and circuitry for transmitting and receiving data on frequencies unique to each modem. Further, the invention relates to a network of these modems which may be interconnected by a passive transmission medium as well as a method which may be utilized to effectuate intercommunications therebetween.

There have previously been proposed various modem configurations and local networking schemes for intercomputer communications. Among these is a baseband local network in which the entire bandwidth of a cable transmission medium is utilized for the intertransmission of data between modems. Various proposals have been made for a networking scheme of such units including establishing a head end to the network which then routinely polls the various modems for information. Other networks have included a series connected system in which information is retransmitted successively from one modem to another until reaching its intended receiver. Alternatively, collision detection multple access (CDMA) may be utilized in which information which is transmitted by one unit is monitored by the same transmitting unit to ensure that it is not garbled by another transmission occurring simultaneously. While high data rates are possible with such baseband systems due to the large bandwidth inherent in the transmission medium, such large data rates are not always needed in a local network. Further, the overall throughput of data through the system can be significantly reduced by numerous transmission collisions.

As an alternative, a broadband system has been proposed which divides the bandwidth into separate and distinct channels allowing for multiple concurrent transmissions between modems on the network. Such units are concomitantly more complex and have been relatively costly to produce, requiring separate transmit and receive frequency synthesis of the various frequencies involved. Conventional frequency synthesis techniques have proven cumbersome in this regard and previous methods for fully utilizing a broadband system have not proven entirely satisfactory.

It would therefore, be highly desirable to provide an improved phase locked loop frequency synthesizer circuit and method for intercomputer communication on a local network of broadband RF modems.

It would further be highly desirable to provide an improved phase locked loop frequency synthesizer circuit and method for intercomputer communication on a local network of broadband RF modems which is readily and inexpensively fabricated and effectuated.

It would still further be highly desirable to provide an improved phase locked loop frequency synthesizer circuit and method for intercomputer communication on a local network of broadband RF modems which can accurately synthesize multiple transmit and receive frequencies for the encoding and decoding of data thereon.

SUMMARY OF THE INVENTION

It is therefore an object of the invention to provide an improved phase locked loop frequency synthesizer circuit and method for intercomputer communication on a local network of broadband RF modems.

It is further an object of the invention to provide an improved phase locked loop frequency synthesizer circuit and method for intercomputer communication on a local network of broadband RF modems which is readily and inexpensively fabricated and effectuated.

It is still further an object of the invention to provide an improved phase locked loop frequency synthesizer circuit and method for intercomputer communication on a local network of broadband RF modems which can accurately synthesize multiple transmit and receive frequencies for the encoding and decoding of data thereon.

What is provided is a phase locked loop frequency synthesizer circuit controlled by a computer supplying control outputs and digital data to a data bus for selectively operating a plurality of voltage controlled oscillators which comprises a phase locked loop frequency synthesizer coupled to the data bus and operating in response to at least one of the control outputs for establishing a selected phase detector output in response to a frequency input. A like plurality of output transmission gates have first input, output and gate terminals respectively coupling the selected phase detector output connected to the first input terminals thereof to an input of the plurality of voltage controlled oscillators. The first gate terminals of the output transmission gates are coupled to at least one of the control outputs. Storage devices are connected to the first output terminals of the like plurality of output transmission gates for sustaining an established voltage level at the input of the plurality of voltage controlled oscillators. A like plurality of input transmission gates have second input, output and gate terminals respectively coupling an output of the plurality of voltage controlled oscillators connected respectively to the second input terminals thereof to the frequency input connected to the second output terminals thereof. The second gate terminals of the input transmission gates are respectively connected to the first gate terminals of a corresponding one of the like plurality of output transmission gates of a selected one of the plurality of voltage controlled oscillators.

Further provided is a method for the intertransmission of data between a plurality of modems each having its own unique transmit and receive frequencies comprising the steps of monitoring at a transmitting one of the modems for a first signal at the receive frequency of a receiving one of the modems, transmitting the data including the receive frequency of the transmitting one on a carrier at the receive frequency of the receiving one when no first signal is detected, awaiting reception at the transmitting one for a second signal at the receive frequency of the transmitting one, and retransmitting the data when the second signal is not received at the transmitting one.

BRIEF DESCRIPTION OF THE DRAWINGS

The abovementioned and other features and objects of the invention and the manner of obtaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
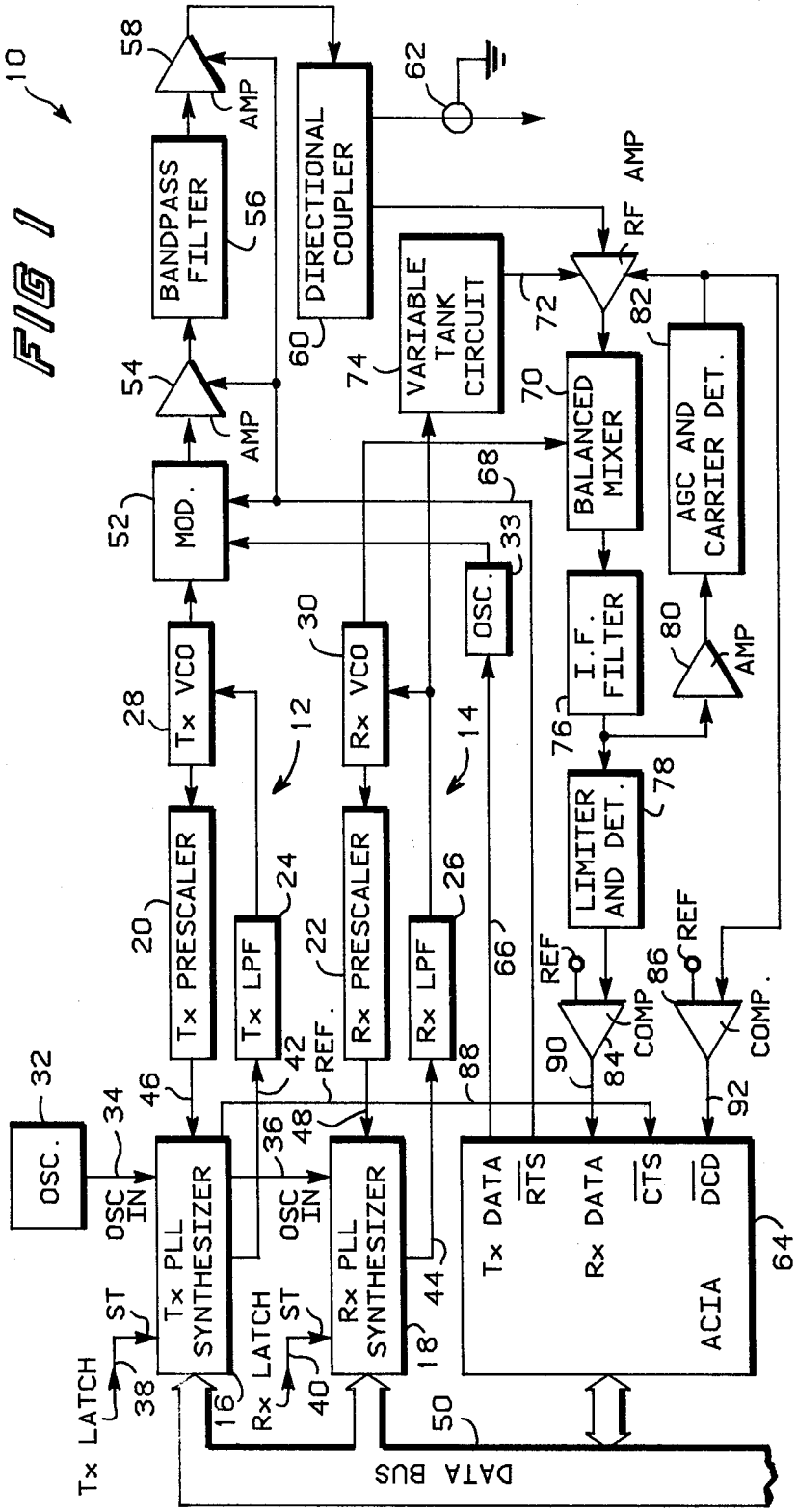
FIG. 1 is a logic flow diagram schematically representing the transmit and receive portions of an embodiment of the invention for coupling to a computer through conventional address, data and control buses.

Referring now to FIG. 1, a broadband RF modem 10 is shown comprising both a transmit and receive section. The transmitter output frequency of transmit PLL network 12 is established by means of a microcomputer or microprocessor (not shown) through digital information input to Tx PLL synthesizer 16. A control output from the microcomputer appearing on Tx latch line 38 latches the digital information to Tx PLL synthesizer 16 appearing on data bus 50. The output of Tx PLL synthesizer 16 is applied on Tx phase detector output line 42 to the input of Tx low pass filter 24. The output of Tx low pass filter 24 is then input to Tx voltage controlled oscillator 28.

One output of Tx voltage control oscillator 28 is then fed back to Tx PLL synthesizer 16 on Tx $f_{in}$ line 46 through Tx prescaler 20. A clocking input to Tx PLL synthesizer 16 is supplied by means of oscillator 32 connected to Tx oscillator input line 34.

Another output of Tx voltage control oscillator 28 is supplied as an input to modulator 52. The output of modulator 52 is coupled through amplifier 54, bandpass filter 56 and amplifier 58 for input to bidirectional coupler 60.

In like manner, receive PLL network 14 comprises Rx PLL synthesizer 18 which is also coupled to data bus 50. A latching signal from the microcomputer appearing on Rx latch line 40 then sets the data appearing on data bus 50. The output of Rx PLL synthesizer 18 is applied on Rx phase detector output line 44 for input to Rx low pass filter 26. The output of Rx low pass filter 26 is supplied as input to Rx voltage control oscillator 30, the output of which is supplied through Rx prescaler 22 for input to Rx PLL synthesizer 18 on Rx $f_{in}$ line 48. A clocking signal to Rx PLL synthesizer 18 is supplied from oscillator 32 through Tx PLL synthesizer 16 on Rx oscillator input line 36.

Additionally asynchronous communications interface adaptor (ACIA) 64 is bidirectionally coupled to data bus 50. Parallel digital data appearing on data bus 50 is serially input to modulator 52 from the output of oscillator 33 which has an input digital data line 66. Data will appear on digital data line 66 in response to an input to ACIA 64 on CTS line 88 which carries an output from Tx PLL synthesizer 16. An additional output of ACIA 64 on RTS line 68 is supplied to modulator 52 as well as amplifiers 54 and 58.

As coupled to coax 62, directional coupler 60 supplies input to RF amplifier 72, the output of which is supplied to balanced mixer 70. An additional input to RF amplifier 72 is supplied from Rx low pass filter 26 through variable tank circuit 74. The output of balanced mixer 70 is input to limiter and detector 78 through IF filter 76. The output of IF filter 76 is also input to RF amplifier 72 through amplifier 80 and AGC and carrier detector 82. The output of AGC and carrier detector 82 is also supplied as an input to comparator 86 for subsequent input to ACIA 64 on DCD line 92. Serial data appearing at the output of limiter and detector 78 is also furnished to ACIA 64 through comparator 84 on Rx data line 90 for subsequent output in parallel to data bus 50. Comparators 84 and 86 also have an input connected to a circuit reference voltage REF.

In the embodiment shown, Tx PLL synthesizer 16 and Rx PLL synthesizer 18 may be furnished as an MC145145 four bit data bus input PLL frequency synthesizer available from Motorola Inc., assignee of the present invention. Additionally, other members of the MC145100 family of PLL synthesizers may be used. As shown, oscillator 32 comprises a conventional circuit utilizing a crystal rated at approximately 10 megahertz. Modulator 52 may also be conveniently designed using an MC1374 TV modulator circuit which could similarly be used for balanced mixer 70. Furthermore, although shown as individual components Rx voltage controlled oscillator 30, balanced mixer 70, IF filter 76, limiter and detector 78 and comparator 84 may be collectively supplied as a Motorola MC3356. ACIA 64 by comprise an MC6850 unit likewise available from Motorola.

In operation, digital data to be transmitted from one broadband RF modem 10 to another, is output from a microcomputer to data bus 50. This parallel data is input to ACIA 64 for output in serialized form on digital data line 66. In like manner, the parallel data on data bus 50 is used to establish the four bit inputs to Tx PLL synthesizer 16 and Rx PLL synthesizer 18 upon receipt of a latch signal from the microcomputer on Tx latch line 38 and Tx latch line 40 respectively.

In a conventional manner, transmit PLL network 12 establishes a dc level output to control Tx voltage control oscillator 28. The output of Tx voltage controlled oscillator 28 establishes the carrier output frequency of the broadband RF modem 10 as established by the microcomputer. Modulator 52 then applies the serial data on digital data line 66 through oscillator 33 to the unique transmit frequency set by transmit PLL network 12 upon input of a request to send signal appearing on RTS line 68 from ACIA 64. In the embodiment shown, frequency shift keying (FSK) modulation is used. However, other modulation techniques may be similarly employed, including PSK, MSK, etc. The output of modulator 52 is thereafter amplified and filtered for input onto a passive transmission medium such as coax 62. The receive frequency of broadband RF modem 10 is established in like manner by means of receive PLL network 14, the output of which from Rx voltage controlled oscillator 30 is supplied as input to balanced mixer 70. Typically, the output of receive PLL network 14 is set at a 10 megahertz offset to the received frequency input from coax 62 as amplified through RF amplifier 72. Thus, a 10 megahertz differential signal is input through IF filter 76 to limiter and detector 78. The output of IF filter 76 is also amplified and coupled through AGC and carrier detector 82 to adjust the gain of RF amplifier 72 as well as provided a carrier detect function for input to ACIA 64 through comparator 86. The serial data output of limiter and detector 78 is input to ACIA 64 on Rx data line 90 for subsequent parallel output to data bus 50. As shown, the output of receive PLL network 14 appearing at the output of Rx low pass filter 26 may also be utilized to adjust the bandpass of RF amplifier 72 by means of a variable tank circuit 74.

Figure 2:
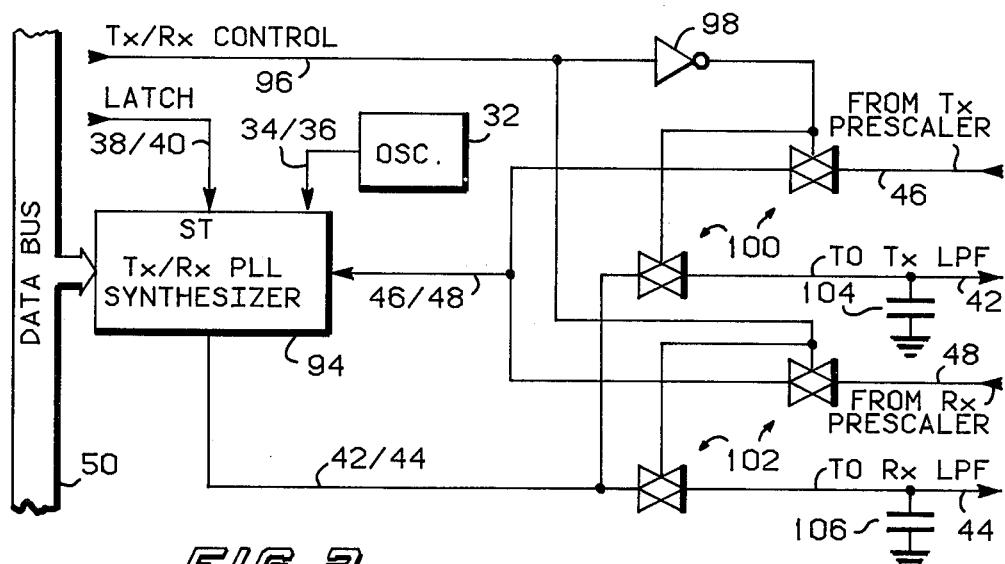
FIG. 2 is a logic flow diagram illustrative of an alternative configuration for the synthesis of both transmit and receive frequencies utilizing a single phase locked loop for use in the embodiment of FIG. 1.

Referring now to FIG. 2, an alternative configuration for the synthesis of both transmit and receive frequencies utilizing a single phase locked loop in lieu of Tx PLL synthesizer 16 and Rx PLL synthesizer 18 of FIG. 1 is shown. Data from a microcomputer is input on data bus 50 to Tx/Rx PLL synthesizer 94 as hereinbefore described. A control output from the microcomputer latches the data on data bus 50 to the four bit input of Tx/Rx PLL synthesizer 94 by means of latch line 38/40. In like manner, oscillator 32 supplies a clocking input on oscillator input line 34/36.

The output of Tx/Rx PLL synthesizer 94 is supplied on phase detector output line 42/44 for input to one each of a pair of Tx transmission gates 100 and Rx transmission gate 102. The output of this pair of Tx transmission gates 100 and Rx transmission gates 102 is then respectivey supplied to Tx phase detector output line 42 and Rx phase detector output line 44 respectively. A Tx storage means 104 and a Rx storage means 106 respectively couple Tx phase detector output line 42 and Rx phase detector output line 44 to circuit ground. Additionally, input to Tx/Rx PLL synthesizer 94 is controlled by means of the other of the pairs of Tx transmission gates 100 and Rx transmission gates 102. In this manner, input from Tx $f_{in}$ line 46 and Rx $f_{in}$ line 48 is supplied on $f_{in}$ line 46/48. Gating signals to Tx transmission gates 100 and Rx transmission gates 102 are supplied from the microcomputer in Tx/Rx control line 96. This signal is applied directly to the gate of Rx transmission gates 102 and is also inverted through inverter 98 and applied to the gate of Tx transmission gates 100.

By means of the circuit illustrated, a single Tx/Rx PLL synthesizer 94 can be used to serve the dual role of Tx PLL synthesizer 16 and Rx PLL synthesizer 18. As hereinbefore described, an output voltage level on phase detector output line 42/44 can be supplied to either Tx low pass filter 24 or Rx low pass filter 26 depending on the signal level on Tx/Rx control line 96. Tx storage means 104 and Rx storage means 106 are used to store this voltage level which is ultimately input to Tx voltage controlled oscillator 28 and Rx voltage controlled oscillator 30 respectively. Upon establishing a voltage level at either Tx voltage controlled oscillator 28 or Tx voltage controlled oscillator 30 a signal on Tx/Rx control line 96 can disconnect phase detector output line 42/44 such that a different frequency can be established by Tx/Rx PLL synthesizer 94. In this manner, Tx/Rx PLL synthesizer 94 can function in either the transmit or receive function while the opposite function is maintained for a few milliseconds by means of either Tx storage means 104 or Rx storage means 106, which in the embodiment shown may comprise capacitors or other voltage storage means.

Figure 3:
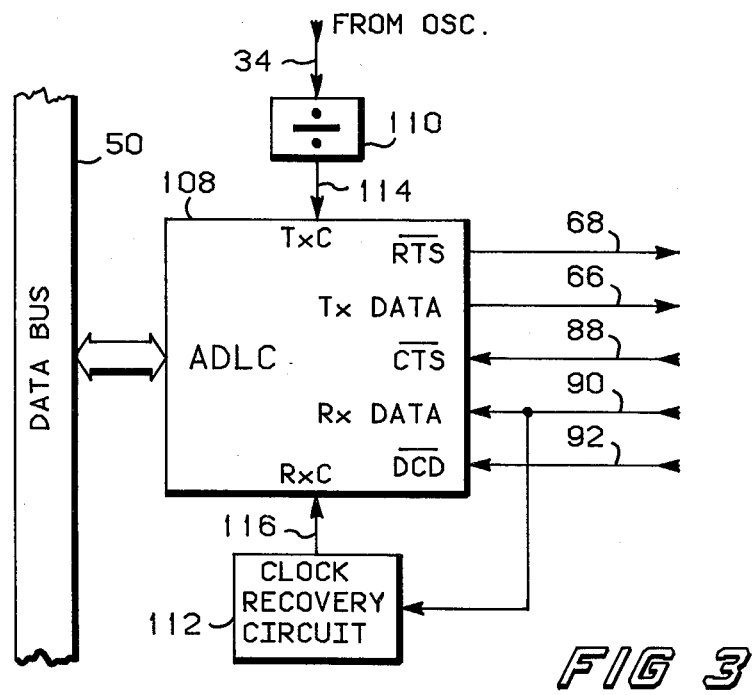
FIG. 3 is a logic flow diagram illustrative of circuitry for use in operating with an alternative data transmission and reception format for use in the embodiment of FIG. 1.

Referring now to FIG. 3, an alternative data transmission format to that of ACIA 64 is shown, comprising advanced data-link controller (ADLC) 108 for use with synchronous data transmission. ADLC 108 is similarly bidirectionally coupled to data bus 50 from the microcomputer. Control inputs to ADLC 108 include CTS line 88, Rx data line 90 and DCD line 92. Due to its synchronous mode of operation, an input from oscillator 32 appearing on Tx oscillator input line 34 is input to ADLC 108 on transmitter clock input 114 from prescaler 110. Likewise, the input to ADLC 108 on Rx data line 90 is input through clock recover circuit 112 on receiver clock line 116. Outputs of ADLC 108 include RTS line 68 and Tx data line 66. ADLC 108 may be a Motorola MC6854 or similar unit.

Functionally, in a local network a plurality of broadband RF modems 10 would be interconnected in a tree configuration by a passive transmission medium such as coax 62. By means of a higher order protocol established by the software of each of the microcomputers associated with an individual one of the broadband RF modems 10, a unique transmit frequency and receive frequency is assigned to each broadband RF modem 10. In a normal operating state, each of the broadband RF modems 10 would be listening at its own unique receive frequency for transmissions at that frequency. Should it be desired to transmit to a selected remote broadband RF modem 10, the receive portion of the potentially transmitting broadband RF modem 10 would tune to the receiving frequency of the desired remote broadband RF modem 10. If a carrier detect signal is input to either ACIA 64 or ADLC 108 on DCD line 92, a number of wait states would be entered into until the potentially receiving unit is through receiving at its assigned frequency. If the receiving portion of the potentially transmitting broadband RF modem 10 detects no output signals going to the potentially receiving broadband RF modem 10, a data burst at the receiving frequency of the potentially receiving broadband RF modem 10 is sent, which data burst also includes the receive frequency unique to the transmitting broadband RF modem 10. Upon receipt of the data, the receiving broadband RF modem 10 will transmit an acknowledge signal plus any requested data to the transmitting broadband RF modem 10 at the receive frequency of the transmitting broadband RF modem 10. Should the transmitting broadband RF modem 10 not receive the acknowledge signal from the receiving broadband RF modem 10 within a predetermined period of time, the data burst is again transmitted from the transmitting broadband RF modem 10 to the receiving broadband RF modem 10 at the receive frequency of the receiving broadband RF modem 10.

If because tuned to the receive frequency of a potentially receiving broadband RF modem 10, a transmitting broadband RF modem 10 is therefore unable to receive data at its own unique receive frequency, the same timeout mechanism of the remote transmitting broadband RF modem 10 will ensure that data intended for the receiving broadband RF modem 10 is subsequently resent.

What has been provided then is an improved phase locked loop frequency synthesizer circuit and method for intercomputer communication on a local network of broadband RF modems which is readily and inexpensively fabricated and effectuated and which can accurately synthesize multiple transmit and receive frequencies for the encoding and decoding thereon.

While there have been described above the principles of this invention in connection with specific apparatus, it is to be clearly understood that this description is made only by way of example and not as a limitation to the scope of the invention.

I claim:

1. A method for the intertransmission of data between a plurality of modems each having its own unique receive frequency comprising the steps of:
   monitoring at a first one of said modems for a first signal at said unique receive frequency of a second one of said modems,
   transmitting said data including said unique receive frequency of said first modem on a carrier at said unique receive frequency of said second modem when no first signal is detected,
   awaiting reception at said first modem for a second signal at the unique receive frequency of said first modem, and
   retransmitting said data when said second signal is not received at said first modem.

2. The method of claim 1 further comprising the step of:
   retuning from said unique receive frequency of said second modem to said unique receive frequency of said first modem prior to said step of awaiting.

3. The method of claim 1 wherein said steps of monitoring, transmitting, awaiting and retransmitting are carried out by means of broadband RF modems.

* * * * *